United States Patent [19]
Kmetz et al.

[11] Patent Number: 5,429,870
[45] Date of Patent: Jul. 4, 1995

[54] BORON CARBIDE COATED REFRACTORY FIBERS

[75] Inventors: Michael A. Kmetz, North Jupiter, Fla.; John M. Laliberte, Southington, Conn.; Steven L. Suib, Storrs, Conn.; Francis S. Galasso, Manchester, Conn.

[73] Assignee: United Technologies Corporation, Hartford, Conn.

[21] Appl. No.: 991,887

[22] Filed: Dec. 17, 1992

[51] Int. Cl.$^6$ .................................................. B32B 9/00
[52] U.S. Cl. .................................... 428/368; 428/367; 427/249; 427/255.2
[58] Field of Search ............................. 427/255.2, 249; 428/378, 392, 688, 704, 366, 367, 368

[56] References Cited

U.S. PATENT DOCUMENTS

| | | | |
|---|---|---|---|
| 3,369,920 | 2/1968 | Bourdeau et al. | 117/46 |
| 3,846,224 | 11/1974 | Leclercq et al. | 161/170 |
| 3,867,191 | 2/1975 | Galasso et al. | 117/169 R |
| 4,225,355 | 9/1980 | Galasso et al. | 106/43 |
| 4,287,259 | 9/1981 | Riley et al. | 428/408 |
| 4,481,257 | 11/1984 | Suplinskas et al. | 428/366 |
| 4,702,770 | 10/1987 | Pyzik et al. | 75/236 |
| 4,713,865 | 1/1973 | Leeds | 117/46 CC |

OTHER PUBLICATIONS

Paper presented at the 16th Annual Conference on Composites and Advanced Ceramic Materials, Jan. 7–10, 1992, Cocoa Beach, Fla., published by The American Ceramic Society, Michael A. Kmetz, John M. Laliberte, Steven L. Suib and Francis S. Gallaso, entitled "*Synthesis, Characterization and Tensile Strength of CVI C/SiC, SiC/SiC, SiC/B$_4$C and C/B$_4$C Composites*", pp. 743–751.

*Primary Examiner*—Christopher W. Raimund
*Attorney, Agent, or Firm*—George J. Romanik

[57] ABSTRACT

A fiber is coated with boron carbide by contacting the fiber with a reaction mixture of a boron source and a carbon source at a temperature of at least about 1050° C. such that the boron source and carbon source react with each other to produce a boron carbide coating on the fiber. The fiber comprises aluminum oxide, SiC, or Si$_3$N$_4$ and the boron carbide coating comprises up to about 40 atomic percent boron.

7 Claims, 2 Drawing Sheets

BORON CARBIDE COATED REFRACTORY FIBERS

TECHNICAL FIELD

The present invention is direction to boron carbide coatings, particularly interfacial coatings for fibers in fiber reinforced composites.

BACKGROUND ART

Interfacial coatings are often applied to fibers in fiber reinforced ceramic matrix or glass matrix composites to control interfacial bonding between the fibers and matrix. By controlling interfacial bonding, such coatings can improve a composite's strength and toughness. In addition to enhancing the composite's mechanical properties, interfacial coatings protect against strong chemical interactions between the fibers and matrix. For composites that will be exposed to elevated temperatures in air, for example in aircraft engines, the fiber coatings also should be oxidation resistant.

An early interfacial coating was a carbon coating applied to silicon carbide (SiC) fibers in SiC fiber reinforced chemical vapor deposited (CVD) SiC matrix composites. Such a coating can be made in situ during composite fabrication or can be applied to the fibers before matrix infiltration. In both cases, the carbon coating enhances the composite's strength and toughness. Carbon interfacial coatings, however, suffer from poor oxidation resistance.

More recently, CVD boron nitride (BN) has been used as an interfacial coating in SiC fiber reinforced CVD SiC matrix composites. Although CVD BN is more oxidation resistant than carbon, it can be difficult to deposit on fibers. At atmospheric pressure, for example, BN deposition often is complicated by homogeneous nucleation, a gas phase reaction that produces a porous, snow-like coating. As a result, BN coatings often are deposited at reduced pressures. The need to use reduced pressures increases the complexity of the equipment used to deposit BN coatings. In addition, BN coatings can reduce the strength of Tyranno ® SiC/TiC fibers (Ube Industries Ltd., Ube City, Japan), SiC fibers, and carbon fibers during fiber coating or when the fibers are introduced into a CVD SiC matrix.

Therefore, what is needed in the industry is an oxidation resistant fiber coating that can be easily applied to fibers at atmospheric pressure and can coat a greater variety of fibers than BN.

DISCLOSURE OF THE INVENTION

The present invention is directed to an oxidation resistant fiber coating that can be applied to fibers at atmospheric pressure and can coat a greater variety of fibers than BN.

One aspect of the invention includes a method of coating a fiber with boron carbide. A fiber is contacted with a reaction mixture of a boron source and a carbon source at a temperature of at least about 1050° C. such that the boron source and carbon source react with each other to produce a boron carbide coating on the fiber. The fiber comprises aluminum oxide, SiC, or $Si_3N_4$ and the boron carbide coating comprises up to about 45 atomic percent boron.

Another aspect of the invention includes a boron carbide coated fiber. The fiber comprises aluminum oxide, SiC, or $Si_3N_4$ and the boron carbide coating comprises up to about 45 atomic percent boron.

These and other features and advantages of the present invention will become more apparent from the following description and accompanying drawing.

BEST MODE FOR CARRYING OUT THE INVENTION

The present invention is directed to a boron carbide (B-C) interfacial coating that provides good mechanical properties and oxidation resistance and can be formed at atmospheric pressure. The coating comprises up to about 45 atomic percent (at %) boron. The remainder of the coating is primarily carbon. A small amount of oxygen also may be present in the coating. For example, the coating may comprise about 45 at % boron, about 50 at % carbon, and about 5 at % oxygen. More than about 45 at % boron in the B-C coating was fund to degrade SiC fibers. Preferably, the coating of the present invention will comprise about 20 at % boron to about 40 at % boron and, most preferably, about 30 at % to about 40 at % boron.

The coating of the present invention may be applied to fibers that will be used as reinforcing phases in ceramic or glass matrix composites. The coating is compatible with most conventional fibers, including carbon, SiC, silicon nitride ($Si_3N_4$), and other silicon-based fibers. Among the fibers coated are the T-300 carbon fiber (Amoco Performance Products, Ridgefield, Conn.), Nicalon ® SiC fiber (Nippon Carbon Co., Tokyo, Japan), HPZ Si-C-N fiber (Dow-Corning, Inc., Midland, Mich.), Tyranno ® SiC/TiC fiber (Ube Industries Ltd., 10 Ube City, Japan), and Sumitomo ® aluminum oxide fiber (Sumitomo Shoji Kabushiki Kaisha, Osaka, Japan, available from Textron Inc., Lowell, Mass.). The fibers may be in the form of yarns or monofilaments. The coating of the present invention also may be applied to substrates other than fibers. For example, the coating may be applied to bulk carbon, SiC, or $Si_3N_4$ or to carbon, SiC, or $Si_3N_4$ matrices.

The coating may be applied to any desired thickness. If the substrate is a yarn, the coating should coat each fiber in the yarn, rather than bridging between two or more fibers. Coatings up to about 2 μm thick may be suitable for many applications. Thinner coatings, for example coatings about 0.1 μm to about 0.5 μm or about 1 μm thick, also can be made. If required by a particular application, coatings thicker than 2 μm can be made. Coating thickness is controlled by controlling the temperature and coating deposition time.

Figure 1:
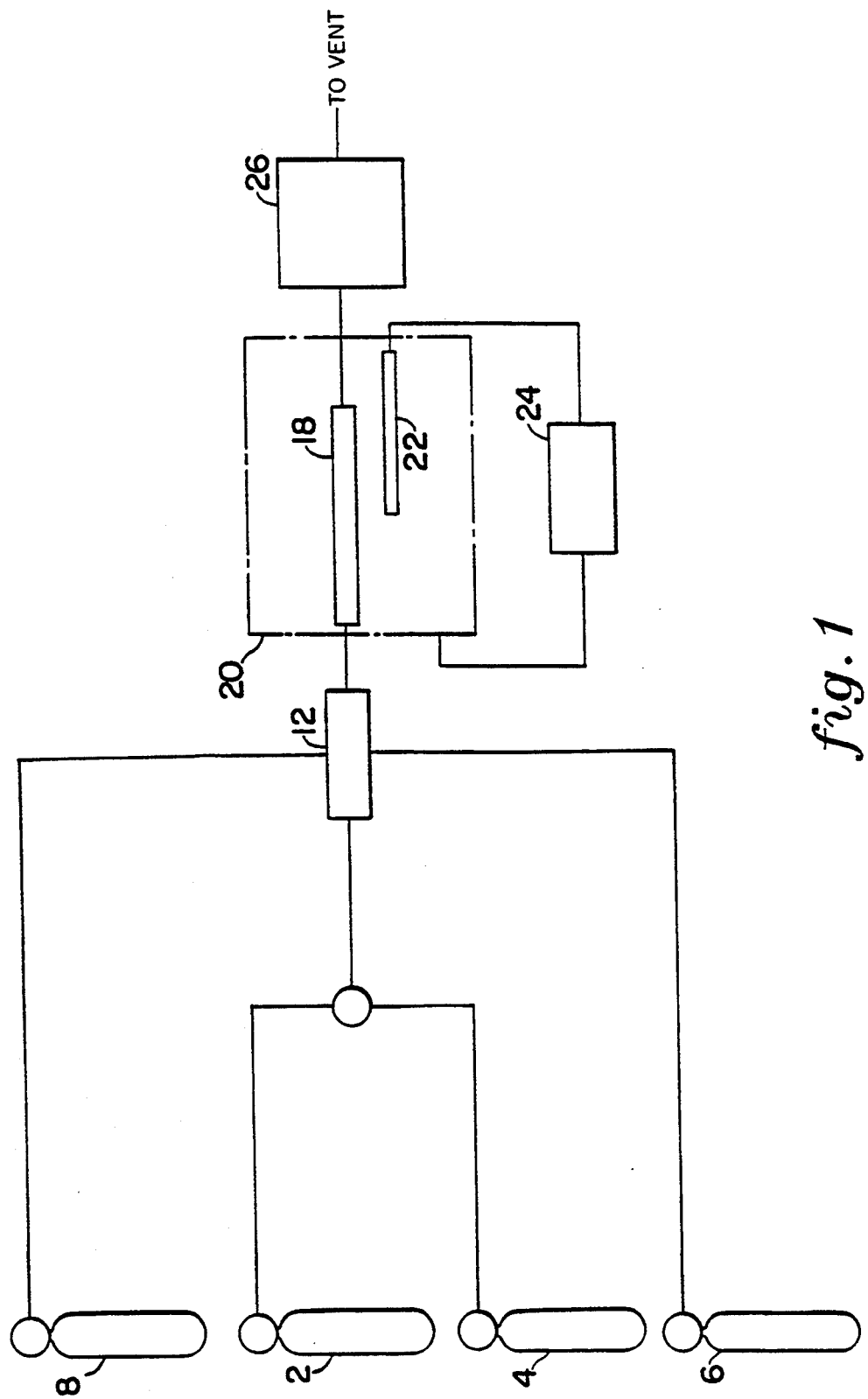
FIG. 1 is a schematic of an apparatus that can be used to make the coating of the present invention.

The coating of the present invention can be made by a chemical vapor deposition (CVD) process in which a suitable substrate is contacted with a reaction mixture of a boron source and a carbon source at a suitable reaction temperature. The boron source may be any reactive compound or mixture of compounds that comprises boron and is a gas at the reaction temperature. For example, the boron source may be a boron halide or a borane. Preferably, the boron source will be $BCl_3$. The carbon source may be any hydrocarbon or mixture of hydrocarbons that is a gas at the reaction temperature. For example, the carbon source may be a saturated or unsaturated aliphatic or aromatic hydrocarbon. Preferred carbon sources include methane ($CH_4$) and propylene ($C_3H_6$). In addition to the boron and carbon sources, the reaction mixture also may include $H_2$ to suppress the formation of soot. The ratio of the boron source to carbon source in the reaction mixture should be selected to provide a coating with up to about 45 at % boron. Preferably, the ratio of the boron source to the carbon source in the reaction mixture will provide a coating with about 20 at % boron to about 40 at % boron and, most preferably, about 30 at % to about 35 at % boron. If $H_2$ is a constituent of the reaction mixture, the amount of $H_2$ in the mixture should be sufficient to suppress soot formation. FIG. 1 is a schematic of an apparatus that can be used to make the coating of the present invention. The apparatus has a boron source cylinder 2, an inert gas cylinder 4, a carbon source cylinder 6, and a hydrogen cylinder 8. Gases in the reaction mixture mix in mixing chamber 12 and flow through a reactor 18, such as a quartz tube reactor. The temperature in the reactor 18 which is positioned inside furnace 20, is controlled with thermocouple 22 and temperature controller 24. Gases exiting the reactor 18 flow through traps 26 and are vented.

The reaction temperature should be at least about 1050° C. to form the B-C coating of the present invention. This minimum temperature is critical because experiments showed that SiC fibers degrade at a reaction temperature of about 1000° C. Preferably, the reaction temperature will be at least about 110 0° C. The upper limit for the reaction temperature is the temperature at which the substrate degrades. For example, the upper limit for SiC fibers is about 1200° C. The upper limit for carbon fibers is substantially higher.

The reaction can be performed at any convenient pressure, including pressures substantially less than atmospheric pressure or substantially greater than atmospheric pressure. For example, the reaction can be performed at about 50 kPa (absolute) to about 500 kPa (absolute). Preferably, the reaction will be performed at about 50 kPa (absolute) to about 200 kPa (absolute). Most preferably, the reaction will be performed at about atmospheric pressure (about 90 kPa (absolute) to about 110 kPa (absolute)) because it requires no special equipment.

The reaction time may be selected to provide a coating of a desired thickness. For example, depositing a B-C coating of the present invention at about 1100° C. provides a deposition rate of about 0.1 µm/min to about 0.2 µm/min. At this deposition rate, therefore, a 2 µm thick coating can be made in about 10 min to about 20 min.

After depositing the coating of the present invention on a fiber, the fiber may be embedded in a ceramic or glass matrix to make a composite. Any matrix compatible with the fibers may be used. For example, suitable matrices include SiC, $B_4C$, $SiO_2$, and $Si_3N_4$. Preferred matrices include SiC and $B_4C$. The matrix may be formed by any conventional method, such as chemical vapor infiltration (CVI). Conventional glass and glass-ceramic matrices also may be used to form composites with coated fibers of the present invention.

The following examples demonstrate the present invention without limiting the invention's broad scope.

EXAMPLES 1-7

(Fiber Coatings)

Tows of Nicalon ® SiC yarns (Nippon Carbon Co., Tokyo, Japan), Tyranno ® SiC/TiC yarns (Ube Industries Ltd., Ube Cite, Japan), and T-300 carbon yarns (Amoco Performance Products, Ridgefield, Conn.) were coated with the B-C coating of the present invention and with prior art carbon and BN coatings by CVD. The CVD apparatus consisted of a Pyrex ® (Corning Glassworks, Corning, N.Y.) glass mixing chamber, a 9 mm diameter fused $SiO_2$ (quartz) reactor tube, a furnace, and a trap to prevent air from back-filling into the reactor tube. Table 1 lists the reaction mixture compositions and deposition conditions for the coatings of Examples 1-7. The coatings were deposited at atmospheric pressure. The B-C coatings were about 0.75 µ m thick. The BN coatings were about 1 µm thick.

TABLE 1

| Material Deposited | Flow Rates (cm³/min) | | | | | | °C. | Deposition Rate µm/min |
|---|---|---|---|---|---|---|---|---|
| | $H_2$ | $BCl_3$ | $N_2$ | $NH_3$ | $CH_4$ | $C_3H_6$ | | |
| Carbon from $CH_4$ | — | — | — | — | 30 | — | 1100 | 0.01–0.008 |
| Carbon from $C_3H_6$ | 122–138 | — | — | — | — | 7–10 | 1100 | 0.002–0.004 |
| B-C | 140 | 20 | — | — | 92 | — | 1100 | 0.1–0.2 |
| BN | — | 12 | 30 | 40 | — | — | 800 | 0.05–0.07 |

X-ray diffraction patterns of the B-C coated Nicalon ® SiC and T-300 carbon yarns showed the B-C was amorphous. X-ray photoelectron spectroscopy showed the B-C comprised 40 at % boron, 54.5 at % carbon, and 5.5 at % oxygen. Table 2 reports the tensile strengths of the fibers coated in Examples 1-7. Data for an uncoated Nicalon ® SiC fiber are included for comparison.

TABLE 2

| Example | Fiber/Coating | Strength of Yarn MPa | Standard Deviation MPa | Number of Tests |
|---|---|---|---|---|
| Comparison | SiC (uncoated) | 1791 | 161 | 12 |
| 1 | SiC/B-C | 1655 | 163 | 13 |
| 2 | SiC/C (from $CH_4$) | 1283 | 125 | 17 |
| 3 | SiC/C (from $C_3H_6$) | 1618 | 88.9 | 20 |
| 4 | C/B-C | 2155 | 368 | 18 |
| 5 | C/C (from $CH_4$) | 711.5 | 59.1 | 10 |
| 6 | C/C (from $C_3H_6$) | 2088 | 410 | 17 |
| 7 | C/BN | 2009 | 335 | 16 |

EXAMPLES 8-17

(Composites)

Fibers prepared as in Examples 1-7 were infiltrated with a matrix material to form single yarn strand, unidirectional composites. SiC matrix composites were made by placing 8 to 10 coated yarns in a 9 mm diameter fused $SiO_2$ reactor tube. The fibers were heated to an infiltration temperature of 1050° C. in flowing $N_2$. A methyltrichlorosilane ($CH_3SiCl_3$) atmosphere was established in the reactor tube and $H_2$ was flowed through the $CH_3SiCl_3$ at a rate of 17 cm³/min to initiate matrix infiltration. Infiltration conditions were maintained for 4 hr to 5 hr.

B$_4$C matrix composites were made by placing 8 to 10 coated yarns in the reaction tube and heating the yarns to an infiltration temperature of 1150° C. in flowing N$_2$. A reaction mixture of 155 cm$^3$/min H$_2$, 35 cm$^3$/min to 40 cm$^3$/min BCl$_3$, and 1.3 cm$^3$/min to 1.4 cm$^3$/min C$_3$H$_6$ was flowed into the tube to initiate matrix infiltration. Infiltration conditions were maintained for 1.5 hr to 2 hr.

Attempts also were made to infiltrate uncoated SiC and carbon yarns with SiC and B$_4$C matrices. These matrices, however, severely degraded the uncoated yarns.

Figure 2:
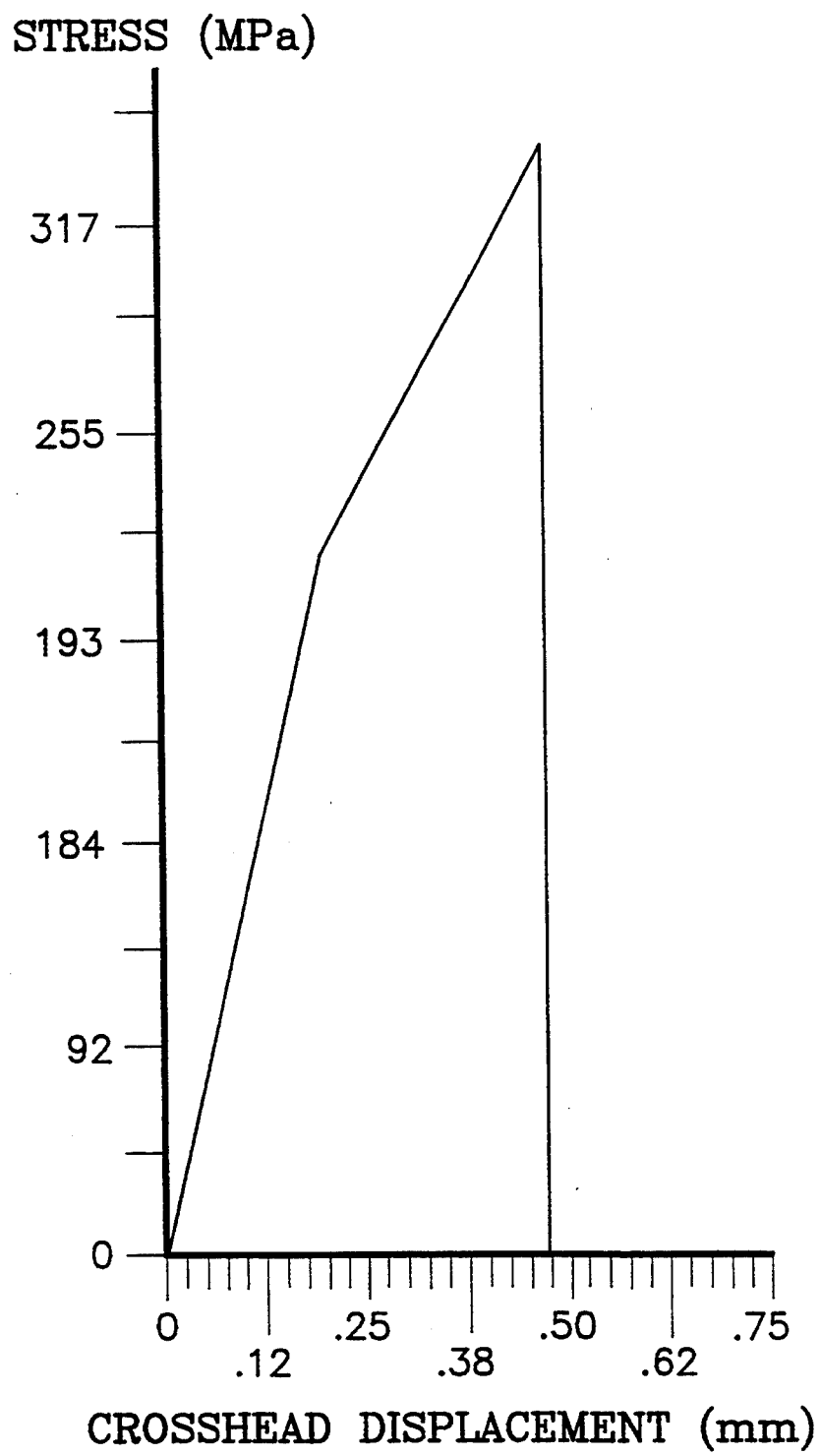
FIG. 2 is a stress-displacement curve for a SiC/B-C/SiC composite of the present invention.

Table 3 reports the tensile strengths of the composites made in Examples 8–17. When fractured, the composites of the present invention displayed fiber pull out at their fracture surfaces. FIG. 2 is a stress-displacement curve for a sample of a SiC/B–C/SiC composite of the present invention. This sample had a proportional limit of 216 MPa and an ultimate stength of 345 MPa. The shape of the stress-displacement curve and the fiber pull out observed at the composite's fracture surfaces indicate the toughness of the composite.

TABLE 3

| Example | Fiber/Coating/ Matrix | Stress on Composite MPa | Standard Deviation MPa | Number of Tests |
|---|---|---|---|---|
| 8 | SiC/B-C/SiC* | 310 | 62 | 8 |
| 9 | SiC/C/SiC (from CH$_4$) | 223 | 16 | 6 |
| 10 | SiC/C/SiC (from C$_3$H$_6$) | 278 | 60 | 7 |
| 11 | SiC/B-C/B$_4$C | 314 | 68 | 8 |
| 12 | SiC/C/B$_4$C | Brittle | — | 10 |
| 13 | C/B-C/SiC | 515 | 58 | 8 |
| 14 | C/C/SiC | 606 | 64 | 5 |
| 15 | C/BN/SiC | Brittle | — | 10 |
| 16 | C/B-C/B$_4$C | 380 | 26 | 4 |
| 17 | C/C/B$_4$C | Brittle | — | 10 |

*High strength composites were obtained with both Nicalon ® and Tyranno ® SiC fibers. When a BN coating was tried, only Nicalon ® SiC fibers made a high strength composite.

EXAMPLES 18–20

(Oxidation Resistance Tests on Composites)

To test the oxidation resistance of the composites of the present invention, the ends of composites made in Examples 8, 13, and 14 were cut to expose fibers. The cut composites were placed in a reactor tube and heated in air to 110° C. for 50 hr. Table 4 reports the tensile strengths of the composites after exposure to oxidizing conditions. Data for Examples 8, 13, and 14 are repeated for comparison. The SiC/B-C/SiC composites displayed very little reduction in strength, while the C/B–SiC composites showed about a 30% reduction in strength. The prior art C/C/SiC composite, on the other hand, was completely degraded.

TABLE 4

| Example | Fiber/Coating/ Matrix | Strength Composite MPa | Standard Deviation MPa | Number of Tests |
|---|---|---|---|---|
| 8 | SiC/B-C/SiC | 310 | 62 | 8 |
| 18 | SiC/B-C/SiC (thermally aged) | 291 | 42 | 8 |
| 13 | C/B-C/SiC | 515 | 58 | 8 |
| 19 | C/B-C/SiC (thermally aged) | 361 | 81 | 8 |
| 14 | C/C/SiC | 606 | 64 | 5 |
| 20 | C/C/SiC (thermally aged) | Brittle | — | 5 |

The coating of the present invention provides several benefits over the prior art. For example, it imparts oxidation resistance and good mechanical properties to a range of composites. The oxidation resistance in particular allows the coating of the present invention to be used at conditions that would degrade prior art carbon coatings. The ability to deposit the coating of the present invention at atmospheric pressure provides a significant advantage over prior art BN coatings, which give best results when reduced pressures are used for deposition. In addition, the coating of the present invention is more inert than BN, allowing it to be deposited on a variety of fibers [i.e., Tyranno ® SiC fibers (Table 3, Example 8) and T-300 carbon fibers (Table 3, Examples 13 and 16)]. By contrast, some prior art coating materials, such as BN, degrade fibers when deposited on the fibers.

The invention is not limited to the particular embodiments shown and described herein. Various changes and modifications may be made without departing from the spirit or scope of the claimed invention.

We claim:

1. A method of coating a fiber with boron carbide, comprising the step of:
   contacting a fiber with a reaction mixture of a boron source and a carbon source at a temperature of at least about 1050° C. such that the boron source and carbon source react with each other to produce a boron carbide coating on the fiber, wherein the fiber comprises aluminum oxide, SiC, or Si$_3$N$_4$ and the boron carbide coating comprises up to about 50 atomic percent boron.

2. The method of claim 1, wherein the boron carbide coating comprises about 20 atomic percent boron to about 40 atomic percent boron.

3. The method of claim 1, wherein the temperature is at least about 1100° C.

4. The method of claim 1, wherein the fiber is coated with boron carbide at about 50 kPa (absolute) to about 500 kPa (absolute).

5. A boron carbide coated fiber made by the method of claim 1.

6. A boron carbide coated fiber, comprising:
   a fiber coated with boron carbide, wherein the fiber comprises aluminum oxide, SiC, or Si$_3$N$_4$ and the boron carbide coating comprises up to about 40 atomic percent boron.

7. The fiber of claim 6, wherein the boron carbon coating comprises about 20 atomic percent boron to about 40 atomic percent boron.

* * * * *